(12) United States Patent
Shen et al.

(10) Patent No.: US 11,639,989 B2
(45) Date of Patent: May 2, 2023

(54) TIME OF FLIGHT TRANSMITTER WITH SELF-STABILIZED OPTICAL OUTPUT PHASE

(71) Applicant: Analog Devices International Unlimited Company, Limerick (IE)

(72) Inventors: Junhua Shen, Wilmington, MA (US); Erik D. Barnes, Cambridge, MA (US); Alberto Marinas, El Puig (ES); Daniel Peter Canniff, Brookline, MA (US); Siwen Liang, Basingstoke (GB)

(73) Assignee: Analog Devices International Unlimited Company, Limerick (IE)

( * ) Notice: Subject to any disclaimer, the term of this patent is extended or adjusted under 35 U.S.C. 154(b) by 1024 days.

(21) Appl. No.: 16/410,868

(22) Filed: May 13, 2019

(65) Prior Publication Data

US 2020/0363506 A1  Nov. 19, 2020

(51) Int. Cl.
| | | |
|---|---|---|
| *G01S 7/484* | (2006.01) | |
| *G01S 17/10* | (2020.01) | |
| *H01S 5/068* | (2006.01) | |

(52) U.S. Cl.
CPC .............. *G01S 7/484* (2013.01); *G01S 17/10* (2013.01); *H01S 5/06821* (2013.01)

(58) Field of Classification Search
CPC ...................................................... G01S 7/484
See application file for complete search history.

(56) References Cited

U.S. PATENT DOCUMENTS

| | | | |
|---|---|---|---|
| 6,466,168 B1 | 10/2002 | Mcewan | |
| 7,012,248 B2 | 3/2006 | Paschalidis | |
| 7,636,150 B1 | 12/2009 | Mccauley et al. | |
| 8,224,413 B2 * | 7/2012 | Say .................... | A61B 5/4839 600/347 |

(Continued)

FOREIGN PATENT DOCUMENTS

| | | | | |
|---|---|---|---|---|
| CN | 101383790 A | * | 3/2009 | ........... H04L 7/0008 |
| CN | 106471796 A | | 3/2017 | |

(Continued)

OTHER PUBLICATIONS

Wens, Mike, et al., An Integrated 1A, 2.2ns Rise-Time Laser-Diode Driver for LIDAR Applications, ESAT-MICAS, KU (https://picture.iczhiku.com/resource/ieee/syiKDDRFWdShpBMx.pdf), 978-1-4244-4353-6 (2009) IEEE, (hereinafter "Wens"); (Year: 2009).*

(Continued)

*Primary Examiner* — Jean Paul Cass
(74) *Attorney, Agent, or Firm* — Schwegman Lundberg & Woessner, P.A.

(57) ABSTRACT

A time-of-flight (ToF) transmitter with self-stabilized optical output phase with minimal overhead is described, where the transmitter may either function as a slave in that the laser pulse phase and width can be controlled by the master ToF receiver, or it can function as a master where the laser control pulse is generated on the same chip or a companion chip. When the ToF transmitter functions as a slave and receives the laser pulse control signal, the techniques of this disclosure can transform the receive path and the pre-driver circuit into part of a delay locked loop (DLL).

20 Claims, 7 Drawing Sheets

(56) References Cited

U.S. PATENT DOCUMENTS

| | | | |
|---|---|---|---|
| 8,558,993 B2* | 10/2013 | Newbury | G01S 7/484 |
| | | | 356/4.1 |
| 8,648,998 B2 | 2/2014 | Van Nieuwenhove et al. | |
| 9,088,369 B2* | 7/2015 | Poddar | H03L 7/00 |
| 9,109,888 B2 | 8/2015 | Korekado et al. | |
| 9,368,936 B1* | 6/2016 | Lenius | G01S 17/10 |
| 9,584,105 B1 | 2/2017 | Foley | |
| 9,784,835 B1* | 10/2017 | Droz | G01S 17/42 |
| 9,834,209 B2* | 12/2017 | Stettner | B62D 15/0265 |
| 10,020,813 B1 | 7/2018 | Mccauley et al. | |
| 10,048,357 B2 | 8/2018 | Wyland | |
| 10,079,643 B2 | 9/2018 | Dutton et al. | |
| 10,212,358 B2 | 2/2019 | Wang et al. | |
| 2006/0158274 A1 | 7/2006 | Self | |
| 2011/0285980 A1* | 11/2011 | Newbury | G01S 7/484 |
| | | | 356/3 |
| 2012/0307211 A1* | 12/2012 | Hofmann | G02B 26/101 |
| | | | 353/31 |
| 2013/0278917 A1 | 10/2013 | Korekado et al. | |
| 2016/0363654 A1 | 12/2016 | Wyland | |
| 2018/0241173 A1* | 8/2018 | Taylor | H01S 5/04256 |
| 2019/0302242 A1* | 10/2019 | Fenigstein | H01L 31/107 |

FOREIGN PATENT DOCUMENTS

| | | | |
|---|---|---|---|
| CN | 111929661 | 11/2020 | |
| DE | 102017106077 B3 | 7/2018 | |
| JP | H0630197 | 2/1994 | |
| JP | H0629161 | 4/1994 | |
| JP | 2009236650 | 10/2009 | |
| JP | 2013195306 | 9/2013 | |
| JP | 2017152660 | 8/2017 | |
| JP | 7074797 B2 | 5/2022 | |
| WO | WO-2014105707 A1 * | 7/2014 | H01S 3/10 |
| WO | 2017156360 | 9/2017 | |
| WO | 2020100673 | 5/2020 | |

OTHER PUBLICATIONS

Marco Z., Paolo M., Salvatore L., Carlo S., Andrea L.L. Time-to-Digital Converter for Frequency Synthesis Based on a Digital Bang-Bang DLL. IEEE Trans. Circuits Syst. I. 2010;57:548-555. doi: 10.1109/TCSI.2009.2023945. (Year: 2009).*

"European Application Serial No. 20165206.2, Extended European Search Report dated Sep. 17, 2020", 7 pgs.

"Japanese Application Serial No. 2020-083873, Notification of Reasons for Refusal dated Mar. 29, 2021", w/ English Machine Translation, 11 pgs.

"European Application Serial No. 20165206.2, Response filed Apr. 20, 2021 to Extended European Search Report dated Sep. 17, 2020", 14 pgs.

"Japanese Application Serial No. 2020-083873, Response filed Jun. 28, 2021 to Notification of Reasons for Refusal dated Mar. 29, 2021", w/ English Claims, 10 pgs.

"Japanese Application Serial No. 2020-083873, Notification of Reasons for Refusal dated Sep. 6, 2021", w/ English Translation, 11 pgs.

Blasco, Guillermo, et al., "A Sub-ns Integrated CMOS Laser Driver with Configurable Laser Pulses for Time-of-Flight Applications", IEEE Sensors Journal, vol. 18, No. 16, (Aug. 15, 2018), 10 pgs.

Deleener, Robin, et al., "A Delay Locked Loop for Instantaneous Time-Of-Flight Sensing Based on a CMOS Demodulation Detector", IEEE Sensors, (2015), 4 pgs.

Kilpela, Ari, "Pulsed Time-of-Flight Laser Range Finder Techniques for Fast, High Precision Measurement Applications", Dept. of Electrical and Information Engineering, Univ. of Oulu, (2004), 98 pgs.

Nissinen, Ilkka, "CMOS Time-to-Digital Converter Structures for the Integrated Receiver of a Pulsed Time-of-Flight Laser Rangefinder", Acta Univ Oulu C, 390, (2011), 100 pgs.

Zalak, Soni, et al., "Comparative Study of Delay Line Based Time to Digital Converter Using FPGA", Intl. Research Journal of Engineering and Technology (IRJET), 4(9), (Sep. 2017), 7 pgs.

"Japanese Application Serial No. 2020-083873, Response filed Dec. 6, 2021 to Notification of Reasons for Refusal dated Sep. 6, 2021", w/ English Claims, 9 pgs.

* cited by examiner

TIME OF FLIGHT TRANSMITTER WITH SELF-STABILIZED OPTICAL OUTPUT PHASE

FIELD OF THE DISCLOSURE

This document pertains generally, but not by way of limitation, to systems for providing light detection and ranging (LIDAR).

BACKGROUND

Time-of-flight (ToF) is an important technique for depth imaging, which finds a wide range of applications including augmented reality, machine vision, facial recognition, e.g., Face ID, industrial automation, and autonomous driving. A ToF sensor includes a transmitter and a receiver. Conceptually, the ToF sensor starts the timer when its transmitter sends out a light pulse and stops the timer when the reflected pulse from an object is received. Based on the time it takes for the pulse to do the round trip and the speed of light, the depth or distance information of the object can be calculated according to the expression $$d = \frac{tc}{2},$$

where d can represent a distance from the system to the illuminated object, t can represent a round trip travel time, e.g., $t_{RECEIVE} - t_{EMIT}$, and c can represent the speed of light.

SUMMARY OF THE DISCLOSURE

This disclosure is directed to, among other things, a time-of-flight (ToF) transmitter with self-stabilized optical output phase with minimal overhead, where the transmitter may either function as a slave in that the laser pulse phase and width can be controlled by the master ToF receiver, or it can function as a master where the laser control pulse is generated on the same chip or a companion chip. When the ToF transmitter functions as a slave and receives the laser pulse control signal, the techniques of this disclosure can transform the receive path and the pre-driver circuit into part of a delay locked loop (DLL).

In some aspects, this disclosure is directed to a time-of-flight (ToF) transmitter circuit with delay locked loop (DLL), the ToF transmitter circuit comprising: a laser driver circuit having a core driver circuit, the laser driver circuit coupled to a receiver circuit and configured to trigger a laser diode to generate an optical output signal in response to a reference signal; and a DLL circuit configured to receive an electrical feedback signal representing the optical output signal from a node in the laser driver circuit, wherein the DLL circuit is configured to lock a phase of the reference signal to a phase of the feedback signal.

In some aspects, this disclosure is directed to a method of operating a time-of-flight (ToF) transmitter, the method comprising: triggering a laser diode to generate an optical output signal in response to a reference signal; and using a delay locked loop, locking a phase of an electrical feedback signal that represents the optical output signal from a node in a laser driver circuit to a phase of the reference signal.

In some aspects, this disclosure is directed to a time-of-flight (ToF) transmitter circuit with delay locked loop (DLL), the ToF transmitter circuit comprising: means for triggering a laser diode to generate an optical output signal in response to a reference signal; and means for locking a phase of a reference signal to a phase of an electrical feedback signal that represents the optical output signal from a node in the means for triggering.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
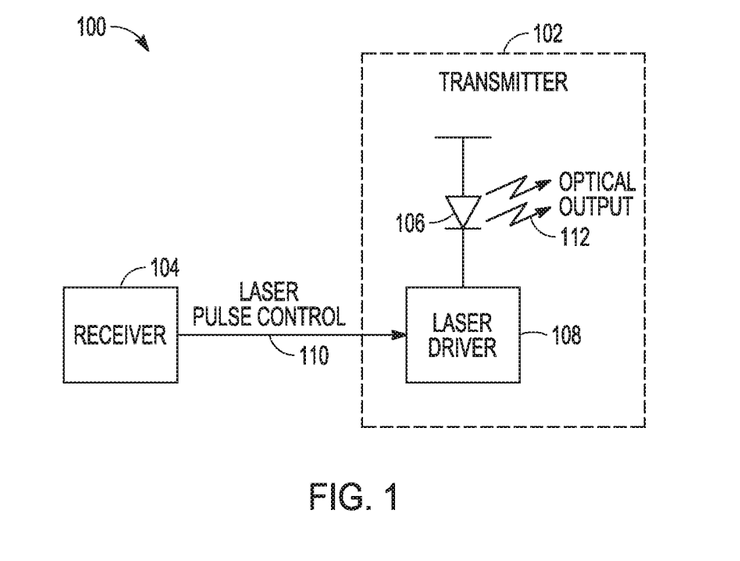
FIG. 1 is a block diagram of an example of a ToF sensor.

FIG. 1 is a block diagram of an example of a ToF sensor. The ToF sensor 100 can include a transmitter circuit 102 and a receiver circuit 104. The ToF transmitter can include a laser diode 106 and a laser driver 108, among other things. The laser diode 106 can be a vertical cavity surface emitting laser (VCSEL), which is a semiconductor-based laser diode that emits an optical beam vertically from its surface, or an edge emitter, which emits an optical beam from an edge. As shown below in FIG. 3, the laser driver 108 can include a pre-driver and one or more power field-effect transistors (FETs) that can trigger the laser diode to turn ON and OFF or switch between different bias conditions to generate an optical output signal.

The receiver 104 can include, among other things, a sensor array and analog-to-digital converter (ADC) circuits to receive and convert a light signal reflected back from an object. The receiver 104 can output a laser pulse control signal 110 that can be received by the transmitter 108. In this manner, the receiver 104 can act as a master in controlling the optical output timing of the transmitter 102.

Figure 2:
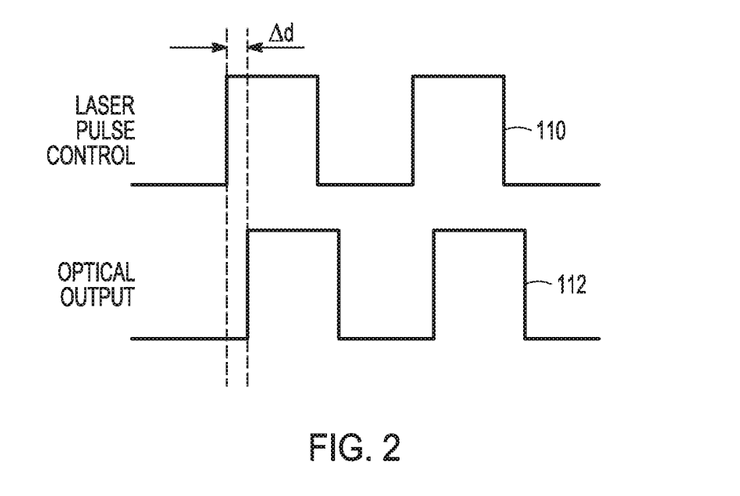
FIG. 2 depicts an example of a timing diagram of a laser pulse control pulse and an optical output pulse.

FIG. 2 depicts an example of a timing diagram of a laser pulse control pulse and an optical output pulse. In theory, the optical output 112 of the laser diode 106 of FIG. 1 can be a slightly delayed version of the laser pulse control signal 110, as seen in FIG. 2. The relative phase stability between both the rising edges and the falling edges of the laser pulse input and optical output can determine a depth accuracy in a ToF system. The fixed delay Δd can be removed by calibration when performing depth calculation for the ToF system.

Figure 3:
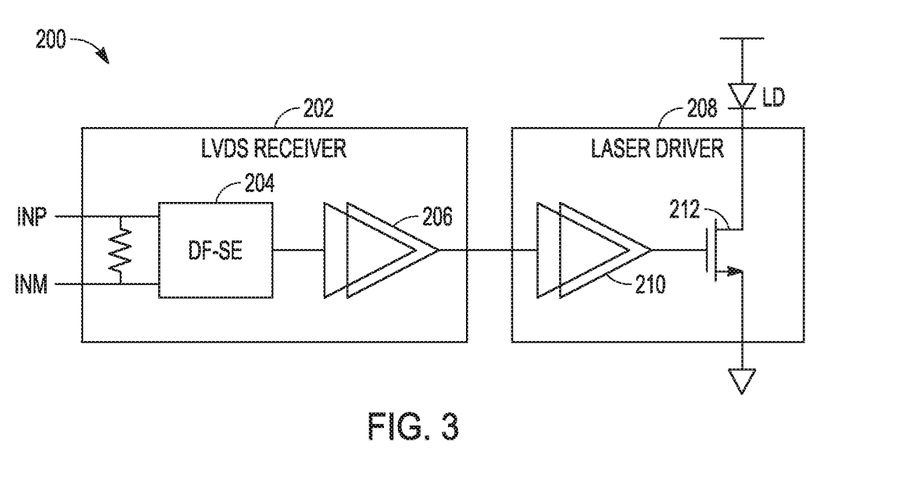
FIG. 3 depicts an example of a ToF transmitter with a low voltage differential signaling input.

FIG. 3 depicts an example of a ToF transmitter with a low voltage differential signaling input. The ToF transmitter 200 is an example of the ToF transmitter circuit 102 of FIG. 1 and can include a receiver circuit 202 to receive the laser pulse control signal INP and INM, e.g., the laser pulse control signal 110 of FIGS. 1 and 2. The receiver 202 can include a differential to signal-ended (DF-SE) conversion circuit 204 coupled to a level shifter and/or buffer circuit 206. The transmitter 200 can include laser driver circuit 208 having a pre-driver circuit 210 coupled to a core laser driver circuit 212, e.g., N-type or P-type FET. It should be noted that other power transistor can be used, such as but not limited to gallium nitride (GaN) transistors.

For continuous-wave (CW) ToF sensors where the optical output has a nominal 50% duty cycle, the frequency of the optical output can range from tens of megahertz to hundreds of megahertz. A low voltage differential signaling (LVDS) interface can be included between the laser pulse control input and the laser driver circuit 208.

Figure 4:
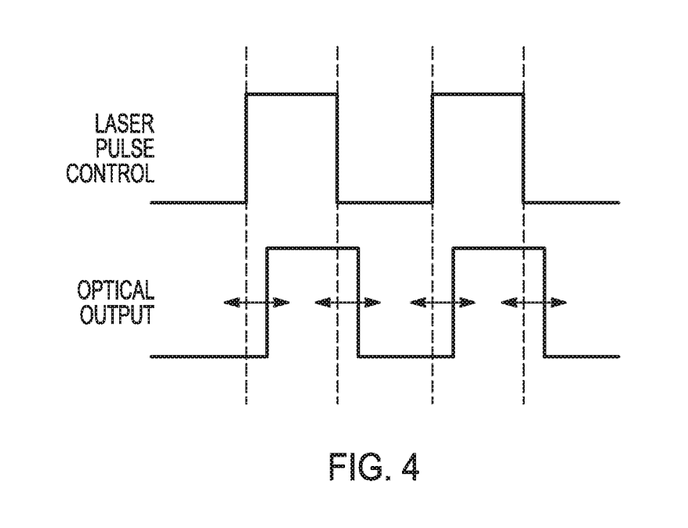
FIG. 4 depicts another example of a timing diagram of a laser pulse control pulse and an optical output pulse.

FIG. 4 depicts another example of a timing diagram of a laser pulse control pulse and an optical output pulse. With the implementation shown in FIG. 3, the optical output pulse may no longer be stable with respect to the laser pulse control input, as indicated by the arrows in FIG. 4. The instability can be due to the delay variation of the LVDS receiver circuit 202 and the laser driver circuit 208 of FIG. 3 over process, voltage, and temperature (PVT) as well as aging effects.

For CW ToF systems, the phase instability of the transmitter optical output can directly result in depth error because the CW ToF relies on phase demodulation to derive the depth information. Likewise, phase stability can be important for pulsed ToF systems, where the depth accuracy is related to the number of integrated photons in each optical pulse, and relative phase stability versus the receiver shutter signal. As an example, as little as 6.7 picoseconds (ps) phase error can result in a one (1) millimeter (mm) depth error derived from expression $$d = \frac{tc}{2}.$$

d=. If the phase instability of the optical output is not addressed during the design of the ToF transmitter, the ToF system may need to perform complex and costly calibrations to mitigate the PVT and aging effect.

In some approaches, the ToF transmitter can act as a master in generating programmable optical output pulse width. The ToF transmitter can introduce two extra phase locked loops (PLL) and replica circuits to stabilize the optical output pulse. Using this approach, the output phase instability can be reduced. However, the effectiveness of the approach can be limited by the matching of the replica circuits, and it is at a cost of significant area and power overhead from the two extra PLLs.

This disclosure describes a ToF transmitter with self-stabilized optical output phase with minimal overhead, where the transmitter may either function as a slave in that the laser pulse phase and width can be controlled by the master ToF receiver, or it can function as a master where the laser control pulse is generated on the same chip or a companion chip. When the ToF transmitter functions as a slave and uses LVDS to receive the laser pulse control signal, as in FIG. 3, the techniques of this disclosure can transform the receive path and the pre-driver circuit of FIG. 3 into part of a delay locked loop (DLL) as shown in FIG. 5.

Figure 5:
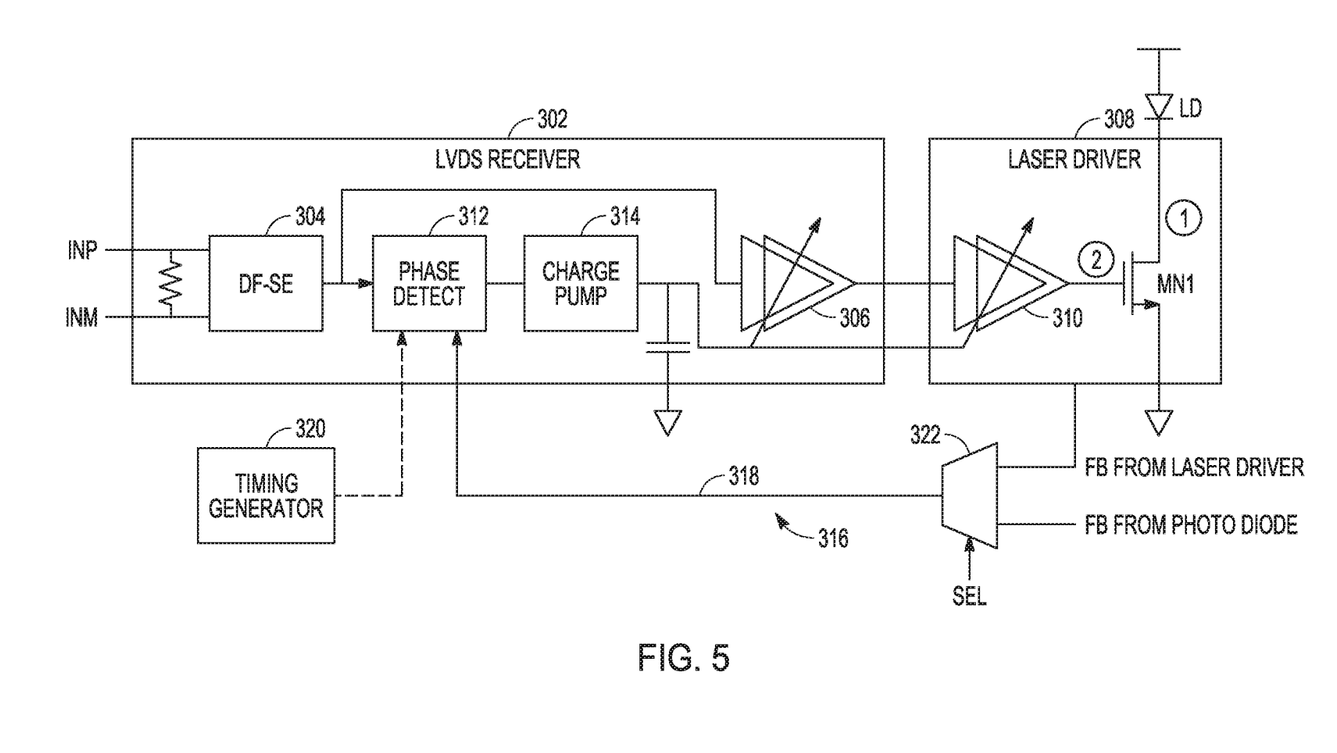
FIG. 5 depicts an example of a ToF transmitter using a DLL in its signal chain in accordance with various techniques of this disclosure.

FIG. 5 depicts an example of a ToF transmitter using a DLL in its signal chain in accordance with various techniques of this disclosure. The ToF transmitter 300 can include a receiver circuit 302 to receive the laser pulse control signal NP and INM, e.g., the laser pulse control signal of FIGS. 1 and 2. The receiver 302 can include a differential to signal-ended (DF-SE) conversion circuit 304 and a level shifter and/or buffer circuit 306. The transmitter 300 can include laser driver circuit 308 having a pre-driver circuit 310 coupled to a core laser driver circuit MN1, e.g., a single N-type or P-type FET. Using the techniques described, the ToF transmitter 300 can include a DLL circuit configured to produce self-stabilized optical output phase by locking a phase of the reference signal to a phase of the feedback signal.

The DLL circuit can include a phase detector circuit 312 coupled to an output of the DF-SE circuit 304, a charge pump circuit 314 coupled to the output of the phase detector circuit 312, and a level shifter and/or buffer circuit 306 coupled to the output of the charge pump circuit 314, as seen in FIG. 5. The DLL circuit can further include the pre-driver circuit 310 of the laser driver circuit 308.

In some example implementations, digital techniques for phase correction can be used. For example, digital DLL techniques can be used instead of an analog DLL with charge pump circuit.

In some example implementations, the level shifters and/or buffer circuit 306 can be delay-adjustable to compensate for any PVT induced delay variations. Additionally or alternatively, the pre-driver circuit 310 of the laser driver circuit 308 can be delay-adjustable to compensate for any PVT induced delay variations. The charge pump circuit 314, for example, can make the DC gain of the feedback loop very high, which can help align the feedback signal with the input signal.

As seen in FIG. 5, a negative feedback loop 316 can be included to apply a selected feedback signal 318 to the phase detector 312, which can align the selected feedback signal with a reference input signal. The selected feedback signal can be an electrical proxy or representation of the optical output signal. Using the negative feedback loop 316, a phase of the feedback signal 318, e.g., the proxy or representation of the optical output signal, can be locked to a phase of a reference input signal. In some example implementations, the reference input signal can include the laser pulse control signal (e.g., INP, INM). In other example implementations, the reference input signal can include a timing generator signal. For example, as shown in FIG. 5, a timing generator circuit 320 can provide the reference input signal directly to the delay locked loop provided by the DLL circuit, without going through the receiver circuit.

In some example configurations, the feedback signal 318 can be an electrical signal from a node of the laser switch, such as the drain of the laser switch MN1 (node 1) or the gate of the laser switch MN1 (node 2), as shown in FIG. 5. Either of these two signals can be a proxy for the optical output signal from the laser diode LD. In some example configurations, the feedback signal 318 can be the output voltage VOUT from the optical receive path shown in FIG. 7.

Using these techniques, the rising edge, for example, of the signal from node 1 or node 2 (or from the output voltage VOUT) can be aligned with the rising edge of the reference input signal applied to the phase detector circuit 312. In this manner, both the rising and falling edges of the feedback signal 318 can be aligned with rising and falling edges of the reference input signal, respectively. The reference input signal applied to the phase detector circuit 312 is a single ended version of the laser pulse control signal applied to the receiver 302, which can be the reference signal.

If the edges are not aligned, the phase detector 312 can output a signal to correct the feedback loop. In response, the delay of the either or both of the level shifters and/or buffer circuit 306 and the pre-driver circuit 310 can be adjusted to align the rising edge of the input signal with the rising edge of the of the signal from node 1 or node 2 (or from the output voltage VOUT). If the edges are aligned, then the output of the phase detector 312 will be zero, on average, and the feedback loop 318 can stabilize at a preset delay of the level shifters and/or buffer circuit 306 and the pre-driver circuit 310.

In the example configuration shown in FIG. 5, a multiplexer circuit 322 can receive both feedback signals and a control signal SEL can select which of the two feedback signals to use. The control signal can be hardcoded, for example, or selected by a user. Although two feedback signals are depicted, this disclosure is not limited to two feedback signals. In other configurations, less than two feedback signals can be used or more than two feedback signals, e.g., N feedback signals, can be used.

Figure 6:
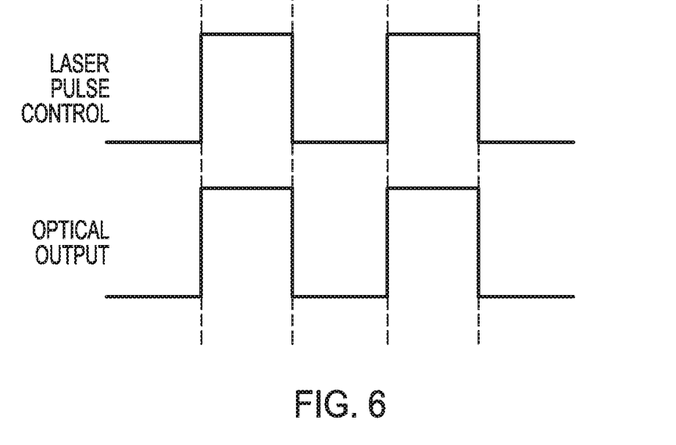
FIG. 6 depicts another example of a timing diagram of a laser pulse control pulse and an optical output pulse.

FIG. 6 depicts another example of a timing diagram of a laser pulse control pulse and an optical output pulse. Using the implementation shown in FIG. 5 with DLL, the optical output pulse can be aligned and locked with respect to the laser pulse control input or other reference signal.

Figure 7:
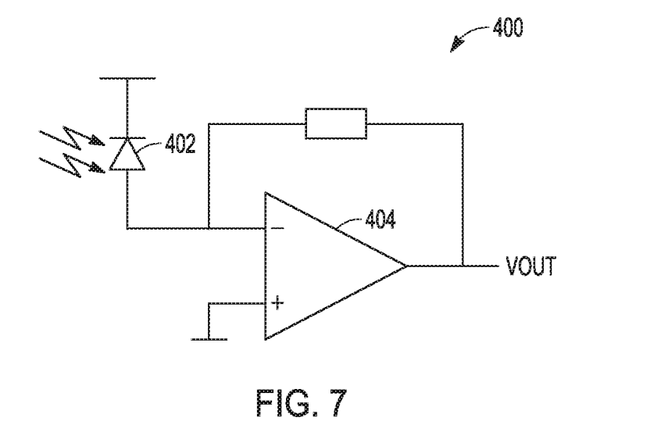
FIG. 7 is an example of an optical sensing circuit of an optical receive path.

FIG. 7 is an example of an optical sensing circuit of an optical receive path. The optical sensing circuit 400 can include a photodiode 402 and an amplifier 404. Although depicted as a transimpedance amplifier (TIA), other implementations need not use a closed loop amplifier to amplify the incoming photodiode current or detect the current edges. Reflected light impinging on the photodiode 402 can generate a current that is converted to an output voltage VOUT by the TIA 404. As mentioned above, in some example configurations, the feedback signal of FIG. 5 can be the output voltage VOUT from the optical receive path.

Figure 8:
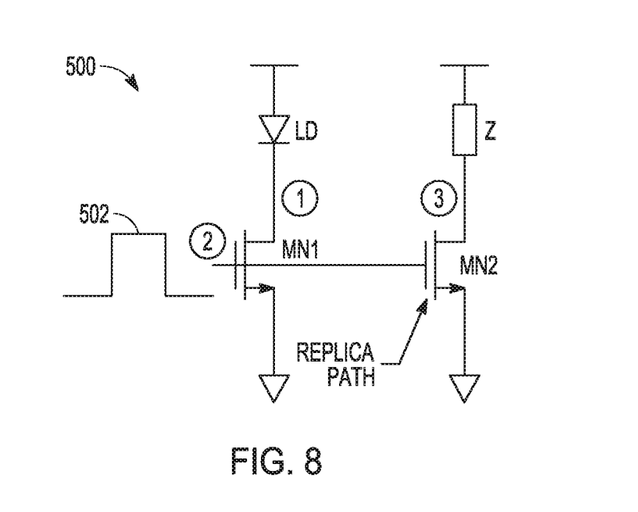
FIG. 8 is an example of a core laser driver that includes a replica path that can be used to implement various techniques of this disclosure.
Figure 9:
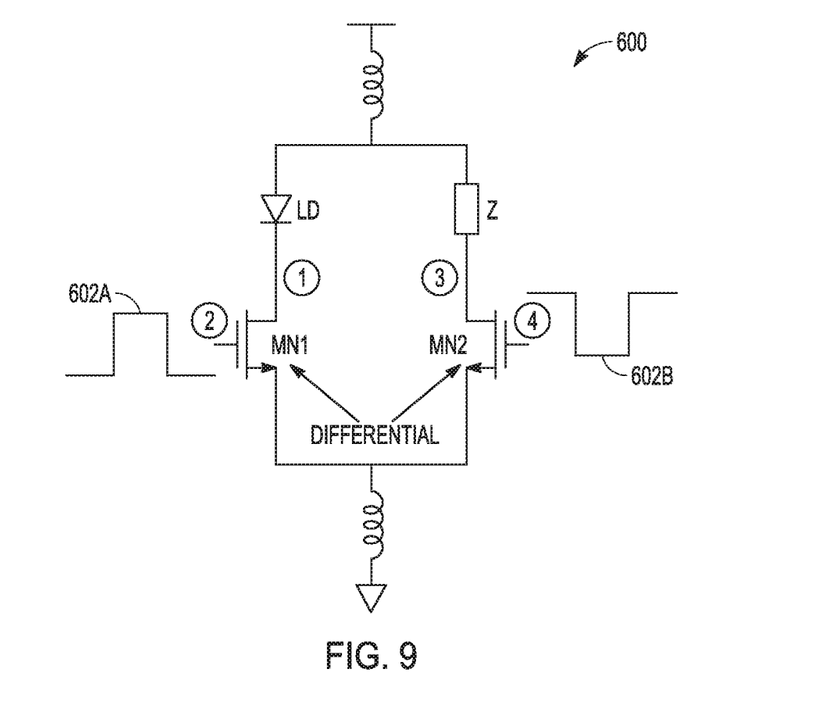
FIG. 9 is an example of a differential pair core laser driver that can be used to implement various techniques of this disclosure.

In addition to the single switch implementation for the core laser driver, such as shown in FIG. 5, other examples of core laser drivers are shown in FIGS. 8 and 9.

FIG. 8 is an example of a core laser driver that includes a replica path that can be used to implement various techniques of this disclosure. The laser driver circuit 500 of FIG. 8 can include a first switch MN1, e.g., a single N-type or P-type FET, coupled to a laser diode LD. In addition, the laser driver circuit 500 can include a replica path that includes a second switch MN2, e.g., N-type or P-type FET, coupled to a load Z, e.g., a resistive load or a diode. The first and second switches MN1 and MN2 can be controlled by the same control signal 502 applied to their respective control nodes, e.g., gate terminals. Either the node 1 signal, e.g., drain voltage of MN1, or the node 2 signal, e.g., gate voltage of MN1, can serve as a feedback signal for the DLL.

When the first switch MN1 turns ON, the response of the laser diode LD can be unpredictable and can cause some ringing on node 1. The replica path with load Z does not suffer from ringing, however, because the response of the load Z can be predictable.

The node 3 signal, e.g., drain voltage of MN2, of the feedback path can serve as a feedback signal for the DLL, where the second switch MN2 is switching in sync with the first switch MN1. Because the replica path may not suffer from ringing, using the node 3 signal of the replica path can improve the feedback signal integrity. Any of the node 1-3 signals can be used as the feedback signal shown in FIG. 5.

FIG. 9 is an example of a differential pair core laser driver that can be used to implement various techniques of this disclosure. The differential pair laser driver circuit 600 of FIG. 9 can include a first switch MN1, e.g., a single N-type or P-type FET, coupled to a laser diode LD. In addition, the laser driver circuit 600 can include a complementary path that includes a second switch MN2, e.g., a single N-type or P-type FET, coupled to a load Z, e.g., a resistive load or a diode, where the first and second switches MN1, MN2 form a differential pair. The first switch MN1 can be controlled by the control signal 602A applied to its control node, e.g., gate terminal, and the second switch MN2 can be controlled by a complementary control signal 602B such that when one of the switches is ON, the other switch is OFF. The sources of both the first switch MN1 and the second switch MN2 can be coupled to ground. Either the node 1 signal, e.g., drain voltage of MN1, or the node 2 signal, e.g., gate voltage of MN1, can serve as a feedback signal for the DLL.

The differential core laser driver 600 can pre-charge any inductances associated with the shared supply and/or ground nodes. The first switch MN1 can turn ON more quickly by pre-charging the inductances. Either the node 3 signal, e.g., drain voltage of MN2, or the node 4 signal, e.g., gate voltage of MN2, can serve as a feedback signal for the DLL. Thus, any of the node 1-4 signals can be used as the feedback signal shown in FIG. 9.

Figure 10:
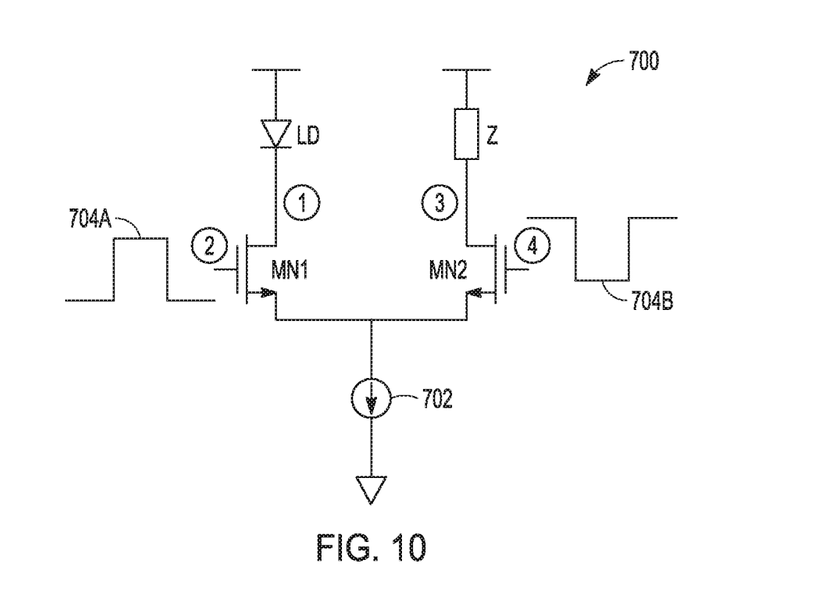
FIG. 10 is an example of a current source-based core laser driver that can be used to implement various techniques of this disclosure.

FIG. 10 is an example of a current source-based core laser driver that can be used to implement various techniques of this disclosure. The current source-based laser driver circuit 700 of FIG. 10 can include a first switch MN1, e.g., N-type or P-type FET, coupled to a load Z, e.g., a resistive load or a diode. In addition, the laser driver circuit 700 can include a second switch MN2, e.g., N-type or P-type FET, coupled to a laser diode LD. The first and second switches MN1 and MN2 can operate differentially. The source terminals of the switches MN1 and MN2 can be coupled together and coupled to a tail current source 702.

The first switch MN1 can be controlled by the control signal 704A applied to its control node, e.g., gate terminal, and the second switch MN2 can be controlled by a complementary control signal 704B such that when one of the switches is ON, the other switch is OFF.

Either the node 1 signal, e.g., drain voltage of MN1, or the node 2 signal, e.g., gate voltage of MN1, can serve as a feedback signal for the DLL. And, either the node 3 signal, e.g., drain voltage of MN2, or the node 4 signal, e.g., gate voltage of MN2, can serve as a feedback signal for the DLL. Thus, any of the node 1-4 signals can be used as the feedback signal shown in FIG. 5.

By isolating the supply with the current source 702, the circuit 700 can offer improved common mode rejection. In addition, the current source 702 can advantageously define the current level of the circuit 700.

With the circuit shown in FIG. 5, the DF-SE circuit 304 is outside of the loop. As such, the delay variation associated with the DF-SE circuit 304 is not compensated by the delay locked loop formed by the DLL circuit. Similarly, when the feedback signal from the optical receive circuit in FIG. 7 is used to implement the DLL of FIG. 5, the delay variation of the transimpedance amplifier (TIA) 404 is outside of the loop. In addition, any delay variation of the laser pulse control signal from the ToF receiver side can also contribute to depth error. By using replica circuits, these remaining delay variations can be canceled out to the first order, as shown below in FIG. 11. A replica circuit can be a copy or a scaled version of the circuitry.

Figure 11:
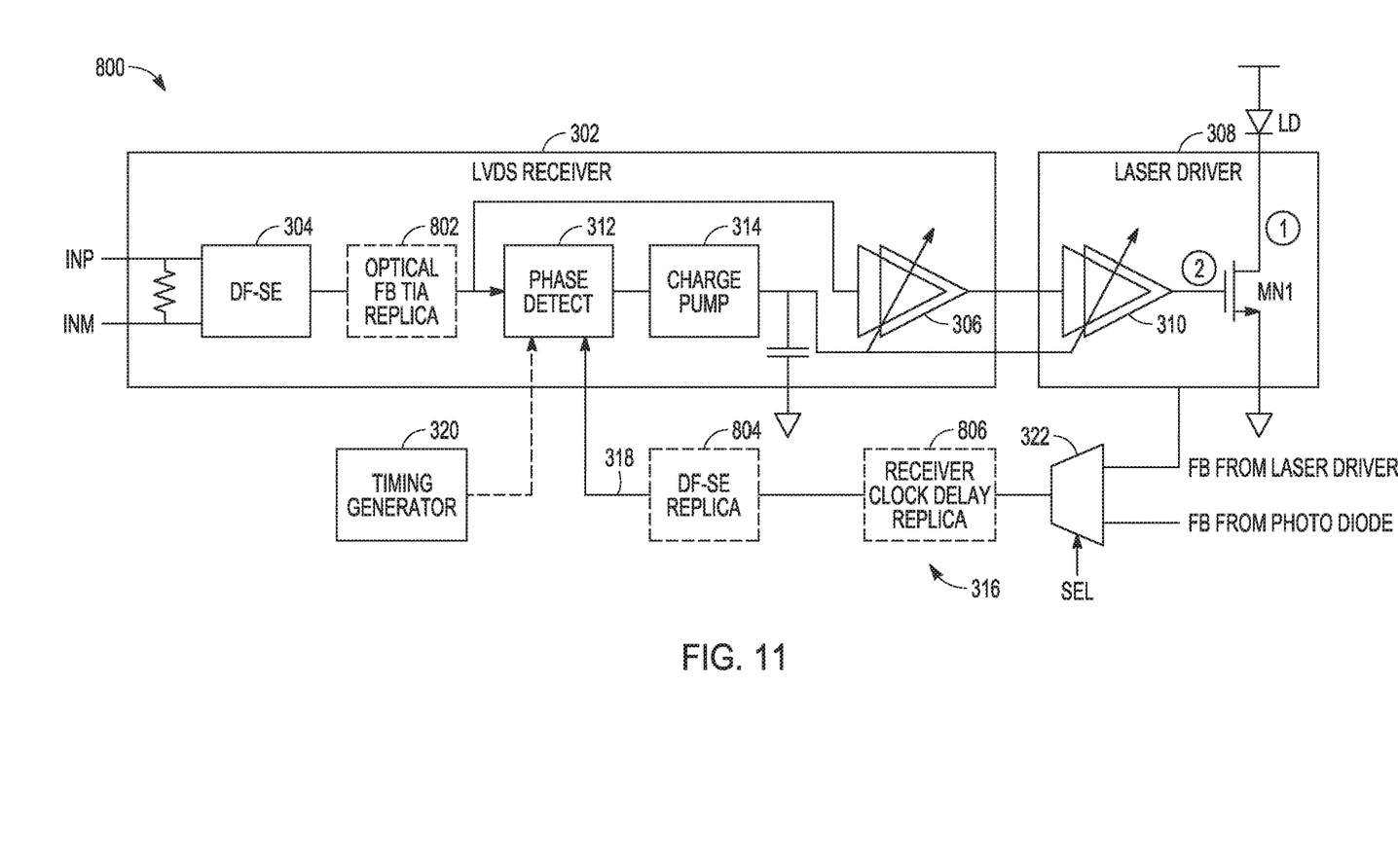
FIG. 11 depicts an example of a ToF transmitter using a DLL and optional replica circuits in accordance with various techniques of this disclosure.

FIG. 11 depicts an example of a ToF transmitter 800 using a DLL and optional replica circuits in accordance with various techniques of this disclosure. Components in FIG. 11 that are similar to components in FIG. 5 are labeled with similar reference numbers and, for purposes of conciseness, will not be described again.

The DLL circuit of FIG. 11 can include the phase detector circuit 312 and the charge pump circuit 314 at the input side of the receive path, following the DF-SE conversion block 304. The DLL circuit can further include the level shifters and/or buffer circuit 306 and the pre-driver circuit 310 of the laser driver circuit 308.

As seen in FIG. 11, the circuit 800 can include an optional optical feedback TIA replica circuit 802 coupled between the DF-SE circuit 304 and the phase detector circuit 312 that can add a delay to cancel any delay variations in configurations that use the feedback signal from the optical receive circuit in FIG. 7. For configurations that do not use the feedback signal from the optical receive circuit in FIG. 7, the optical feedback TIA replica circuit can be bypassed (not depicted), if present. The optional optical feedback TIA replica circuit 802 can be considered to be outside the DLL circuit.

Optionally, to account for the delay variation associated with the DF-SE circuit 304, the circuit of FIG. 11 can include a DF-SE replica circuit 804 positioned within the feedback loop 316 and, as such, can be considered to be inside the DLL circuit.

Optionally, to account for any delay variation of the laser pulse control signal from the ToF receiver, e.g., receiver 104 of FIG. 1, the circuit 800 can include a receiver clock delay replica circuit 806 and, as such, can be considered to be inside the DLL circuit.

By adding one or more optional replica circuits, the input signal and the feedback signal, which can be considered to be a proxy of the optical output of the laser diode, can be aligned.

Although the techniques were described above using an LVDS receiver for the ToF transmitter, it is not necessary to do so. Rather, in some example implementations, a ToF transmitter with a complementary metal-oxide-semiconductor (CMOS) receiver can be used.

Figure 12:
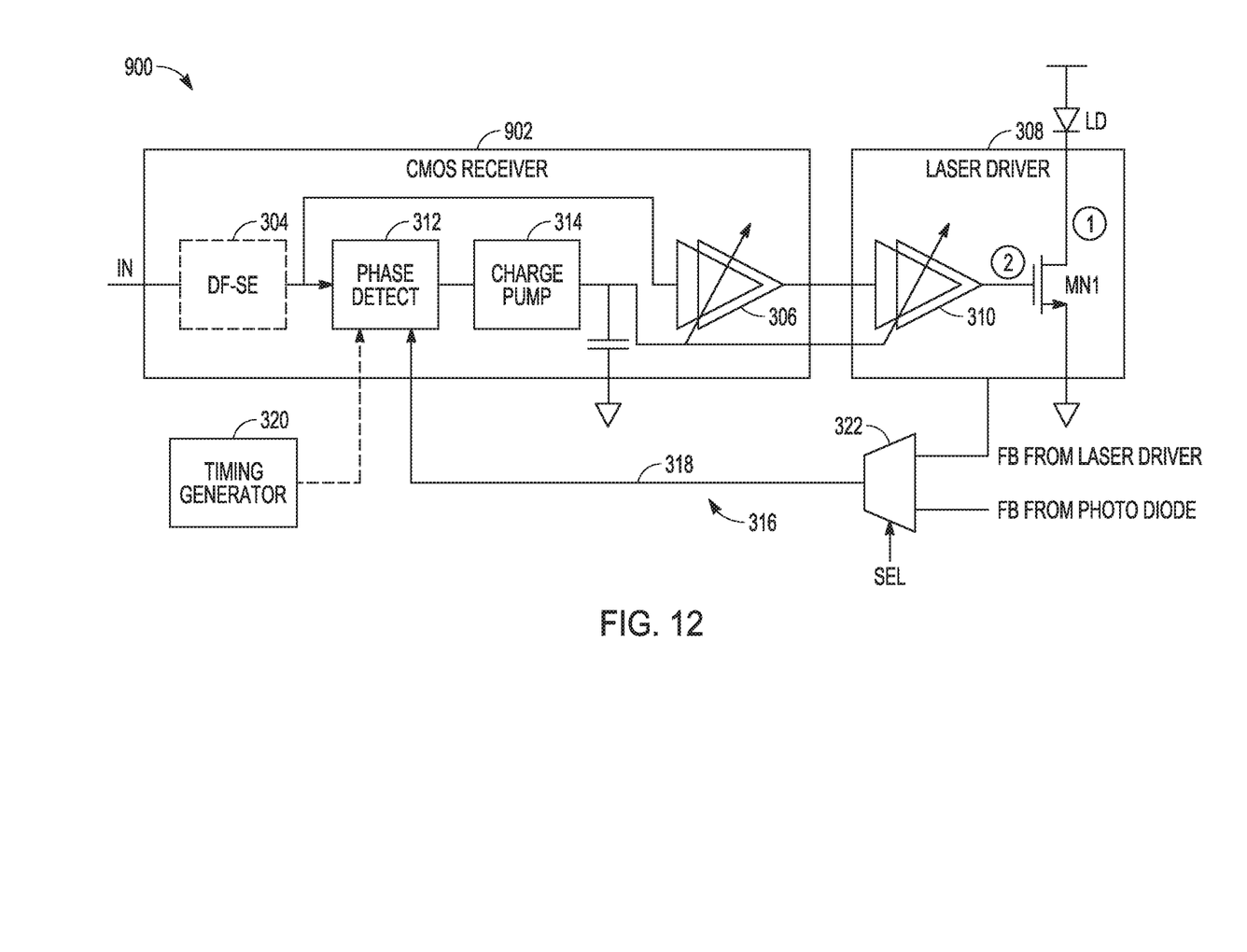
FIG. 12 depicts another example of a ToF transmitter using a DLL in accordance with various techniques of this disclosure.

FIG. 12 depicts another example of a ToF transmitter 900 using a DLL in accordance with various techniques of this disclosure. Components in FIG. 12 that are similar to components in FIG. 5 are labeled with similar reference numbers and, for purposes of conciseness, will not be described again. The DLL circuit of FIG. 12 can include the phase detector circuit 312 and the charge pump circuit 314 at the input side of the receive path, following the optional DF-SE conversion block 304. The DLL circuit can further include the level shifters and/or buffer circuit 306 and the pre-driver circuit 310 of the laser driver circuit 308.

The transmitter circuit 900 can include a CMOS receiver circuit 902 instead of an LVDS receiver circuit. The laser driver 308 can include a pre-driver circuit 310 coupled to a core laser driver circuit MN1, e.g., N-type or P-type FET. Using the techniques described, the ToF transmitter 900 can include a self-stabilized optical output phase. The input of the receiver 902 can be either single-ended or differential, as indicated by an optional differential to signal-ended (DF-SE) conversion circuit 304.

Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A time-of-flight (ToF) transmitter circuit with delay locked loop (DLL), the ToF transmitter circuit comprising:
   a laser driver circuit having a core driver circuit, the laser driver circuit coupled to a receiver circuit and configured to trigger a laser diode to generate an optical output signal in response to a reference signal; and
   a DLL circuit configured to receive an electrical feedback signal representing the optical output signal from a node in the laser driver circuit, wherein the DLL circuit is configured to lock a phase of the reference signal to a phase of the feedback signal.

2. The ToF transmitter circuit of claim 1, wherein the DLL circuit includes:
   a phase detector circuit; and
   a charge pump circuit.

3. The ToF transmitter circuit of claim 1, wherein the reference signal includes a laser pulse control signal.

4. The ToF transmitter circuit of claim 1, wherein the reference signal includes a timing generator signal.

5. The ToF transmitter circuit of claim 1, wherein the reference signal is a pulsed signal.

6. The ToF transmitter circuit of claim 1, wherein the reference signal includes a laser pulse control signal, the circuit further comprising:
   a receiver circuit configured to receive the laser pulse control signal.

7. The ToF transmitter circuit of claim 6, wherein the receiver circuit is a low voltage differential signaling receiver or a CMOS receiver.

8. The ToF transmitter circuit of claim 1, wherein the laser driver circuit includes a pre-driver circuit and the core driver circuit.

9. The ToF transmitter circuit of claim 8, wherein the core driver circuit includes a single N-type or P-type field-effect transistor (FET), and wherein the node in the laser driver circuit includes a drain terminal or a gate terminal of the FET.

10. The ToF transmitter circuit of claim 8, wherein the core driver circuit includes a first N-type or P-type field-effect transistor (FET), wherein the core driver circuit further includes a replica circuit having a second N-type or P-type FET, and wherein the node in the laser driver circuit includes a drain terminal or a gate terminal of the FET in the replica circuit.

11. The ToF transmitter circuit of claim 8, wherein the core driver circuit includes a differential pair of N-type or P-type field-effect transistors (FETs), and wherein the node in the laser driver circuit includes a drain terminal or a gate terminal of the FET.

12. The ToF transmitter circuit of claim 11, wherein the core driver circuit further includes a current source coupled to source terminals of the differential pair of FETs.

13. The ToF transmitter circuit of claim 1, further comprising at least one replica circuit positioned either inside or outside of the DLL circuit.

14. A method of operating a time-of-flight (ToF) transmitter, the method comprising:
   triggering a laser diode to generate an optical output signal in response to a reference signal; and
   using a delay locked loop, locking a phase of an electrical feedback signal that represents the optical output signal from a node in a laser driver circuit to a phase of the reference signal.

15. The method of claim 14, wherein locking the phase of the feedback signal representing the optical output signal to the phase of the reference signal includes:
   aligning both a rising edge and a falling edge of the feedback signal with a rising edge and a falling edge of the reference signal, respectively.

16. The method of claim 14, wherein the reference signal includes a laser pulse control signal.

17. A time-of-flight (ToF) transmitter circuit with delay locked loop (DLL), the ToF transmitter circuit comprising:
   means for triggering a laser diode to generate an optical output signal in response to a reference signal; and
   means for locking a phase of a reference signal to a phase of an electrical feedback signal that represents the optical output signal from a node in the means for triggering.

18. The ToF transmitter circuit of claim 17, wherein the means for triggering a laser diode to generate an optical output signal in response to a laser pulse control signal includes a core driver circuit having one or more N-type or P-type field-effect transistor (FETs), and wherein the electrical feedback signal is provided by a drain terminal or a gate terminal of one of the FETs.

19. The ToF transmitter circuit of claim 17, wherein the reference signal includes a laser pulse control signal or a timing generator signal.

20. The ToF transmitter circuit of claim 17, further comprising at least one replica circuit positioned either inside or outside the means for receiving the feedback signal.

* * * * *